United States Patent
Taniguchi et al.

(10) Patent No.: US 8,304,761 B2
(45) Date of Patent: Nov. 6, 2012

(54) ORGANIC FIELD EFFECT TRANSISTOR AND MAKING METHOD

(75) Inventors: Masateru Taniguchi, Suita (JP); Tomoji Kawai, Suita (JP); Hideyuki Kawaguchi, Suita (JP); Ikuo Fukui, Joetsu (JP)

(73) Assignees: Osaka University, Osaka (JP); Shin-Etsu Chemical Co., Ltd., Tokyo (JP)

( * ) Notice: Subject to any disclaimer, the term of this patent is extended or adjusted under 35 U.S.C. 154(b) by 709 days.

(21) Appl. No.: 12/054,693

(22) Filed: Mar. 25, 2008

(65) Prior Publication Data

US 2008/0308791 A1 Dec. 18, 2008

(30) Foreign Application Priority Data

Mar. 26, 2007 (JP) ................................ 2007-078193
Mar. 26, 2007 (JP) ................................ 2007-078195

(51) Int. Cl.
*H01L 51/00* (2006.01)

(52) U.S. Cl. ................. 257/40; 257/642; 257/E51.007; 257/E51.027; 438/99; 438/780

(58) Field of Classification Search ............... 257/40, 257/642, 759, E51.007, E51.027; 438/99, 438/623, 780, 781, 789, 790, 793, 794

See application file for complete search history.

(56) References Cited

U.S. PATENT DOCUMENTS

| | | | |
|---|---|---|---|
| 5,347,144 A | 9/1994 | Garnier et al. | |
| 6,825,508 B2 * | 11/2004 | Fujita et al. | 257/197 |
| 7,265,380 B2 | 9/2007 | Kawai et al. | |
| 2005/0045876 A1 | 3/2005 | Fukui | |
| 2005/0279995 A1 | 12/2005 | Shin et al. | |
| 2006/0006380 A1 * | 1/2006 | Shin et al. | 257/40 |
| 2007/0088149 A1 * | 4/2007 | Ong et al. | 528/373 |

FOREIGN PATENT DOCUMENTS

| | | |
|---|---|---|
| EP | 1 705 726 | 9/2006 |
| JP | 5-508745 A | 12/1993 |
| JP | 2005-72528 A | 3/2005 |
| JP | 2006-303453 A | 11/2006 |

OTHER PUBLICATIONS

Stassen et al, Appl. Phys. Lett., vol. 85, p. 3899-3901 (2004).
EP Search Report issued Mar. 17, 2011 in Application No. EP 08251045.4.
Shekar, et al., "Organic Thin Film Transistors: Materials, Processes and Devices", Korean J. Chem. Eng., 21(1), pp. 267-285, 2004.

* cited by examiner

*Primary Examiner* — Matthew Landau
*Assistant Examiner* — Colleen E Snow
(74) *Attorney, Agent, or Firm* — Birch, Stewart, Kolasch & Birch, LLP

(57) ABSTRACT

In an organic field effect transistor with an electrical conductor-insulator-semiconductor structure, the semiconductor layer is made of an organic compound, and the insulator layer is made of a polymer obtained through polymerization or copolymerization of 2-cyanoethyl acrylate and/or 2-cyanoethyl methacrylate.

8 Claims, 4 Drawing Sheets

ORGANIC FIELD EFFECT TRANSISTOR AND MAKING METHOD

CROSS-REFERENCE TO RELATED APPLICATION

This non-provisional application claims priority under 35 U.S.C. §119(a) on Patent Application Nos. 2007-078193 and 2007-078195 filed in Japan on Mar. 26, 2007 and Mar. 26, 2007, respectively, the entire contents of which are hereby incorporated by reference.

TECHNICAL FIELD

This invention relates to organic field effect transistors (OFETs) having an electrical conductor layer-insulator layer-semiconductor layer structure, especially OFETs for use in liquid crystal displays and bipolar OFETs exhibiting both p- and n-type transistor characteristics, and a method of fabricating the same.

BACKGROUND ART

Conventional thin-layer field effect transistors (TFTS) utilizing silicon semiconductors or compound semiconductors are used in common integrated circuits and in wide-spreading other applications. In particular, the use of TFTs in liquid crystal displays is well known. Nowadays LC displays are making continuous progress toward larger size and more precise definition. The requirement to incorporate a greater number of TFTs corresponding to the number of pixels becomes stronger than ever.

However, ordinary metal based semiconductors used in the art cannot avoid the problem that slight defects are generated in TFTs formed on the screen as a result of treatments including patterning and etching using photoresists during circuitry formation on the substrate. Such treatments impose a certain limit to the effort of reducing the cost of TFT manufacture. This is also true for other flat displays such as plasma displays and organic EL displays when TFTs are used therein.

The recent trend toward larger size and more precise definition poses a propensity to increase the probability of defectiveness in the TFT manufacture. It is thus strongly desired to minimize such TFT defects.

When patterning, etching and other treatments using photoresists are involved, it is difficult to reduce the fabrication cost below a certain limit.

For TFTs with a metal-insulator-semiconductor (MIS) structure, attempts have been made to use organic materials as the insulator and semiconductor, but only a few reports refer to organic insulating materials. For example, JP-A 5-508745 (WO 9201313 or U.S. Pat. No. 5,347,144) describes a device using an insulating organic polymer having a dielectric constant of at least 5 as the insulator layer and a polyconjugated organic compound having a weight average molecular weight of up to 2,000 as the semiconductor layer. The device exerts a field effect and has a carrier mobility of about $10^{-2}$ cm$^2$ V$^{-1}$s$^{-1}$. Since the semiconductor layer is formed by evaporating α-sexithienyl as an organic semiconductor material, treatments including patterning and etching using photoresists are necessary, failing to achieve a cost reduction.

With respect to organic insulating materials, for example, JP-A 5-508745 and JP-A 2005-72528 (U.S. Ser. No. 10/925, 986, EP 045255178.8, CN 200410089945.1) describe polyvinyl alcohol and cyanoethylpullulane, which are of the structure having hydroxyl groups in the molecule. If hydroxyl groups are present in the gate insulating film material, there is a likelihood that hydroxyl groups trap electrons in proximity to the interface with the organic semiconductor layer. Then the device exhibits little or no n-type transistor characteristics, or even when exhibits some, has the drawback of a low carrier mobility.

While the number of new applications to which conventional TFTs utilizing silicon semiconductors or compound semiconductors are employed is increasing, the requirements of lower cost and flexibility are imposed on these devices. To comply with such requirements, active research works have been made on organic semiconductors because of possible fabrication of devices having many advantages including low cost and flexibility. The implementation of organic semiconductors into a commercial practice will lead to the development of printable integrated circuits, electronic paper and the like. However, most organic semiconductors exhibit p-type behavior while only C60 and few other materials exhibit n-type behavior.

N-type organic semiconductors are key materials for the establishment of organic electronic devices including p-n junctions.

In general, organic semiconductors are not prone to polarity inversion from p- to n-type because they have so great a band gap as compared with silicon semiconductor that no inversion layer is formed even when the band is deflected by applying an extra gate voltage. Although the inversion layer may be formed by inducing numerous carriers at the interface between the gate insulating film and the organic semiconductor, a high gate voltage can cause dielectric breakdown if a prior art gate insulating film is used. It is thus difficult to induce a sufficient quantity of carriers to provoke polarity inversion.

For instance, Appl. Phys. Lett., Vol. 85, p 3899 (2004) describes to use an aluminum oxide thin film having a high withstand voltage, high dielectric constant and low leakage current as the insulating film and a single crystal as the organic semiconductor. Allegedly the use of a single crystal as the organic semiconductor eliminates the influence of grains and trap level in the semiconductor thin film, and it is thus expected to gain a high mobility. Although the oxide insulator has the advantages of ease of thin film formation and a high dielectric constant, it undesirably has a low withstand voltage due to the essential presence of oxygen vacancies.

Further, JP-A 2006-303453 (U.S. Pat. No. 7,265,380, EP 06251639.8, CN 200610074140.9) discloses a bipolar OFET comprising a certain organic polymer, typically cyanoethylpullulane as the insulator layer material. It exhibits p-type behavior in the normal state. In order for the transistor to develop n-type behavior, however, a polling operation of applying between source and gate electrodes a voltage which is not less than the coercive electric field and not more than the withstand voltage of the polymer must be carried out.

SUMMARY OF THE INVENTION

An object of the present invention is to provide an organic field effect transistor (OFET) with an electrical conductor-insulator-semiconductor structure using organic materials as the semiconductor and insulator layers and having a higher carrier mobility than prior art transistors, and a method of fabricating the same.

Another object is to provide a bipolar OFET exhibiting both p- and n-type transistor characteristics without a need for a special process, and a method of fabricating the same.

The inventors have found that the degradation of n-type transistor characteristics is caused by hydroxyl groups in the material of which the insulator layer is made and that when a polymer having a high dielectric constant and free of hydroxyl groups is used as the material of which the insulator layer is made, and a carrier mobility is increased over the prior art level.

The inventors have further found that the use of such a polymer ensures that a bipolar OFET is obtainable in a relatively simple way, which transistor exhibits both p- and n-type transistor characteristics by a simple process of changing the polarity of a gate voltage applied thereacross, without a need for a special process like polling, that is, transistor exhibits normal p-type transistor characteristics when a negative gate voltage is applied and n-type transistor characteristics when a positive gate voltage is applied.

In one aspect, the present invention provides an organic field effect transistor (OFET) with an electrical conductor-insulator-semiconductor structure. The material of which the semiconductor layer is made comprises an organic compound. The material of which the insulator layer is made comprises a polymer obtained through polymerization or copolymerization of a monomer having the formula (1) and/or a monomer having the formula (2).

$$CH_2=CHCOO-(CH_2)_2-CN \quad (1)$$

$$CH_2=C(CH_3)COO-(CH_2)_2-CN \quad (2)$$

The preferred transistor is a bipolar organic field effect transistor exhibiting both p- and n-type transistor characteristics.

In a preferred embodiment, the polymer contains the monomers of formulae (1) and (2) in a molar ratio from 100:0 to 50:50.

In a preferred embodiment, the material of which the semiconductor layer is made is an organic compound which is dissolvable in an organic solvent and has a weight average molecular weight of more than 2,000 to 1,000,000. More preferably, the material of which the semiconductor layer is made is a polythiophene.

In another aspect, the present invention provides a method for fabricating an organic field effect transistor, comprising the steps of applying a solution of a polymer in an organic solvent to a gate electrode in the form of an electrical conductor layer, drying the applied polymer solution to form an insulator layer on the electrical conductor layer, and laying a semiconductor layer on the insulator layer, the polymer being obtained through polymerization or copolymerization of a monomer having formula (1) and/or a monomer having formula (2).

BENEFITS OF THE INVENTION

In the OFET having an electrical conductor-insulator-semiconductor structure, since both the materials of the semiconductor and insulator layers are organic compounds and the material of which the insulator layer is made is a hydroxyl-free polymer, carrier mobility is increased without detracting from n-type transistor characteristics.

A further advantage of the invention includes a reduced cost of fabrication. In circuit-forming technology used with conventional silicon semiconductors or inorganic semiconductors and insulators, photoresist processing steps including patterning and etching are required. On the other hand, the OFET of the invention can be easily fabricated by solvent process including printing technique using, for example, ink jet, whereby the probability of defectiveness on circuits is reduced and fabrication cost is decreased.

A bipolar OFET exhibiting both p- and n-type transistor characteristics without a need for polling is obtainable. The invention is applicable to p-n junctions, inverter circuits, and lasers.

DESCRIPTION OF THE PREFERRED EMBODIMENTS

Figure 1:
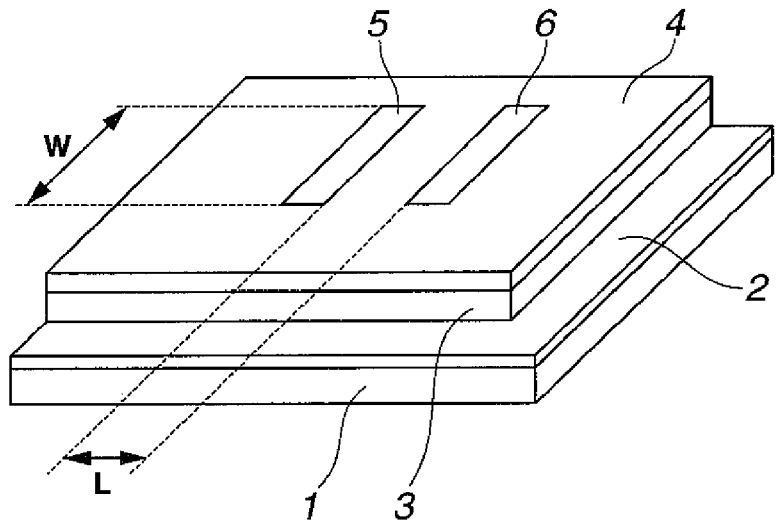
FIG. 1 is a perspective view of an OFET in one embodiment of the invention.

Referring to FIG. 1, one exemplary bipolar organic field-effect transistor (OFET) of the invention is illustrated as comprising a substrate 1 of $SiO_2$ or the like, an electrical conductor layer 2 formed on the substrate 1 and serving as a gate electrode, an insulator layer 3 formed on the electrical conductor layer 2, and a semiconductor layer 4 formed on the insulator layer 3. Source and drain electrodes 5 and 6 are formed on the semiconductor layer 4. It is noted that glass or polymer sheet may also be used as the substrate.

The electrical conductor layer used herein may be a conventional indium tin oxide (ITO) film, or a single metal layer such as Au, Cu or Al or a metal layer laminate such as Au/Ti, Cu/Ti or Al/Ti, which is formed by physical vapor deposition (PVD) or metal organic chemical vapor deposition (MOCVD). Since a possibility of film formation by printing is advantageous to the objects of the invention, the use of conductive paste is preferred as long as it raises no practical problems. The conductive pastes used herein include conductive carbon black pastes such as Ketjen black pastes, and conductive metal pastes such as silver pastes.

Since the polarity inversion phenomenon of semiconductor largely depends on the band alignment between semiconductor and insulator and the quantity of charge accumulated at the interface, the insulator's properties are more predominant from the standpoint of polarity inversion. Accordingly, a thin film that offers transistor performance and can accumulate giant charges at the interface is desired for polarity inversion.

The inventors learned that organic insulating materials generally have a high withstand voltage and deliver low leakage current. As previously pointed out, oxygen vacancies are not avoidable in an aluminum oxide thin film as the insulator film. Likewise, molecular vacancies exist in organic compounds. While oxygen vacancies associated with oxides can alter the electronic state of an insulator, molecular vacancies in organic compounds are not correlated to the electronic state. Then the organic compounds deliver low leakage current. The organic insulating material, however, cannot accumulate a multiplicity of charges at the interface due to a low dielectric constant. Continuing further investigations, the inventors have found that use of a specific high-molecular-weight compound or polymer having a high withstand voltage and a high dielectric constant and free of hydroxyl groups as the insulator layer-forming material enables to construct a bipolar OFET exhibiting both p- and n-type transistor characteristics.

In the OFET of the invention, the material of which the insulator layer is made comprises a polymer obtained through polymerization or copolymerization of a monomer having the formula (1) and/or a monomer having the formula (2). The polymer is soluble in an organic solvent and preferably such that a 20% by weight solution of the polymer in dimethylformamide has a viscosity of 30 to 8,000 mPa-s at 20° C. Note that the viscosity is measured by a rotational viscometer.

$$CH_2=CHCOO-(CH_2)_2-CN \quad (1)$$

$$CH_2=C(CH_3)COO-(CH_2)_2-CN \quad (2)$$

Specifically, the polymer is a homopolymer of the monomer of formula (1), i.e., 2-cyanoethyl acrylate or the monomer of formula (2), i.e., 2-cyanoethyl methacrylate, which are soluble in a solvent like dimethylformamide, or a copolymer of these two monomers.

These polymers may be prepared by radical polymerization of the above monomers using radical polymerization initiators. The radical polymerization initiator used herein may be ordinary initiators, for example, azo initiators such as 2,2'-azobisisobutyronitrile, 2,2'-azobis(2,4-dimethylvaleronitrile) and 2,2'-azobis-2-methylbutyronitrile and peroxide catalysts such as benzoyl peroxide. Since the polymer used herein should have cyano groups in its molecular structure, the preferred radical polymerization initiator is an azo initiator having a nitrile group. The polymerization initiator is preferably added in such amounts that a ratio of moles of the polymerization initiator to moles of all monomers may range from 0.005 to 0.02. If the amount of the polymerization initiator added is less than the range, polymerization may not fully proceed due to deactivation of radicals or the like. If the amount is excessive, some problems may arise such as difficult control of polymerization reaction and formation of a polymer having too high a degree of polymerization, which is insoluble in solvents and inconvenient in the subsequent use.

To control the polymerization reaction, a chain transfer agent such as laurylmercaptan may be used. The chain transfer agent is preferably added in such amounts that a ratio of moles of the chain transfer agent to moles of the polymerization initiator may range from 0.05 to 1.0. If the amount of the chain transfer agent added is less than the range, such inconvenience as difficult control of polymerization reaction may arise depending on the amount of initiator added. If the amount is excessive, polymerization reaction may not fully proceed.

The polymerization process may be any of well-known processes like bulk, solution, suspension, and emulsion polymerization. The solvents used in the solution polymerization are not particularly limited as long as they allow the monomers to be dissolved therein and do not interfere with the polymerization reaction. Exemplary solvents include acetone, N,N'-dimethylformamide, esters, and ethers. When the purifying step following the polymerization reaction is taken into account, acetone, N,N'-dimethylformamide, and the like are preferred because these solvents are miscible with the crystallizing solvent and with water.

The concentration of the monomer(s) in the polymerization solvent is not particularly limited. However, the polymerization reaction which follows the solution polymerization mode may not fully proceed if the concentration of the monomer in the solvent is too dilute. In this regard, a monomer concentration of at least 10% by weight is preferred. If the polymerization solvent is not used, the reaction is bulk polymerization.

Homopolymers of 2-cyanoethyl acrylate of formula (1) tend to have a high dielectric constant and a low softening temperature. As compared with homopolymers of 2-cyanoethyl acrylate of formula (1), homopolymers of 2-cyanoethyl methacrylate of formula (2) tend to have a low dielectric constant and a high softening temperature. The difference in dielectric constant (or relative permittivity) is accounted for by the fact that when a comparison is made between the monomers, 2-cyanoethyl acrylate of formula (1) and 2-cyanoethyl methacrylate of formula (2), the intramolecular content of cyanoethyl groups, which are bipolar groups, is higher in 2-cyanoethyl acrylate than in 2-cyanoethyl methacrylate. With respect to softening temperature, it is the well-known fact that when a comparison is made between acrylate homopolymers and methacrylate homopolymers, the methacrylate homopolymers have higher softening temperatures, and the same is true to polymers of cyanoethyl monomers.

The operation of OFET is believed to rely on the mechanism that when a potential is applied to the gate, cyanoethyl groups, which are bipolar groups, in the polymer of which the insulator layer is made orient at the interface between insulator and semiconductor layers to facilitate channel formation. It is then believed that a material having a higher dielectric constant provides better performance like mobility. If the softening temperature is too low, the insulator layer may soften by a temperature rise during drive, failing to exert stable performance. Where the material of the insulator layer is a copolymer of the monomers of formulae (1) and (2), the molar ratio of monomer (1) to monomer (2) is preferably in a range from 100:0 to 50:50, and more preferably from 90:10 to 50:50. If the molar ratio of monomer (2) is higher than the range, there may arise problems of a higher softening temperature, a loss of flexibility at the interface, and a lower dielectric constant.

In the OFET of the invention, the material of which the semiconductor layer is made is an organic compound. Specifically, suitable organic compounds for forming the semiconductor layer include pentacene; metal phthalocyanines such as copper phthalocyanine and iron phthalocyanine; low molecular weight compounds such as α-sexithienyl; and high molecular weight compounds such as polythiophenes, polypyrroles, polyanilines, polyacetylenes, poly(thienylene vinylene)s, and poly(phenylene vinylene)s. In the case of high molecular weight compounds, the semiconductor layer prefers an organic solvent-soluble polymer having a weight average molecular weight (Mw) of more than 2,000 to 1,000,000 as measured by GPC relative to polystyrene standards. Examples of the preferred polymer include polythiophenes, polypyrroles, polyanilines, polyacetylenes, poly(thienylene vinylene)s, and poly(phenylene vinylene)s. In consideration of factors including solubility in organic solvents and ease of processing, polythiophenes, typically poly(3-hexylthiophene) are most preferred.

In forming a semiconductor layer on the insulator layer, ordinary deposition techniques such as vacuum evaporation are employed when low molecular weight compounds are used as the semiconductor layer-forming material. If the organic compound for forming the semiconductor layer has the nature of being dissolvable in an organic solvent whether it is low or high molecular weight one, a solution coating/drying process may be employed to lay the semiconductor layer on the insulator layer. In this embodiment, the organic compound for forming the semiconductor layer should be dissolved in an organic solvent in which the insulator layer is not dissolvable. This is because it is generally believed that when a semiconductor layer and an insulator layer are otherwise formed by such solution coating lamination, the interface state does not become uniform.

The OFET may be fabricated by a method of forming an organic semiconductor layer on an organic insulator layer by evaporation or another method of dissolving an organic semiconductor and an organic insulator in organic solvents, respectively, and coating and drying, with the latter method being preferred for simplicity. Suitable organic solvents in which the compound for forming the insulator layer is dissolved include, for example, N-methyl-2-pyrrolidone, N,N'-dimethylformamide, acetone, acetonitrile, and γ-butyrolactone. Suitable organic solvents in which the compound for forming the semiconductor layer is dissolved include, for example, chloroform, toluene, hexane and alcohols. In either case, one or more solvents may be used.

Specifically, a solution in an organic solvent of a polymer obtained through polymerization or copolymerization of the monomer of formula (1) and/or the monomer of formula (2) is coated on a gate electrode in the form of a metal layer and dried to form an insulator layer. Subsequently, a solution of a semiconductor layer-forming organic compound in an organic solvent in which the insulator layer is not dissolvable is coated and dried to form a semiconductor layer. For example, a substrate is selected from glass and conventional polymer sheets; and a metal layer serving as the gate electrode is formed on the substrate by sputtering or by applying a metal paste or conductive polymer through spin coating, screen printing or ink jet printing, and drying. Alternatively, commercially available ITO-coated glass may be used.

On the gate electrode thus formed, a solution of the insulator layer-forming material in an organic solvent is coated by spin coating, screen printing or ink jet printing, and dried, thus forming an insulator layer.

Thereafter, a solution of the semiconductor layer-forming material in another organic solvent (in which the insulator layer-forming polymer is not dissolvable) is coated onto the insulator layer by spin coating, screen printing or ink jet printing, and dried to form a semiconductor layer. Before this stage, the surface of the insulator layer may be subjected to well-known rubbing or physical treatment in order that semiconductor molecules be oriented at the interface between the insulator layer and the semiconductor layer.

Finally, source and drain electrodes are formed on the semiconductor layer by sputtering or by applying a metal paste or conductive polymer through screen printing or ink jet printing, and drying.

The OFET of the invention has a structure including a gate electrode in the form of a metal layer, an insulator layer formed thereon, a semiconductor layer formed thereon, and source and drain electrodes formed on the semiconductor layer. When a potential is applied to the gate to develop an electric field, electric charges are generated in the semiconductor in proximity to the insulator layer by the field effect, to form a conductive region, known as channel, in the semiconductor layer. This means that the interface state between insulator and semiconductor layers is crucial, that is, the flatter the interface, the better become the results.

Though not critical, it is preferred that the insulator layer have a thickness of 0.2 to 10 μm, more preferably 0.5 to 3 μm, the semiconductor layer have a thickness of 50 to 300 nm, more preferably 50 to 100 nm, and the metal layer have a thickness of 30 to 50 nm.

In the embodiment wherein the OFET is a bipolar organic field-effect transistor, the transistor exhibits n-type transistor characteristics upon application of a positive gate voltage and p-type transistor characteristics upon application of a negative gate voltage.

EXAMPLE

Examples of the invention are given below by way of illustration and not by way of limitation.

Example 1

A 500-ml three-necked flask equipped with a condenser and stirrer was purged with nitrogen and charged with 70 g of 2-cyanoethyl acrylate monomer which had been distilled by an ordinary vacuum distillation technique. The flask was then charged with 163 g of dry acetone as a polymerization solvent, and 2,2'-azobisisobutyronitrile as a radical initiator in an amount to give a molar ratio of 0.01 relative to the monomer. Further 0.001 mole of lauryl mercaptan was added as a chain transfer agent. A nitrogen inlet tube was connected to the flask and reaction was run under conditions including a temperature of 60° C. and a time of 300 minutes. At the end of reaction, the reaction solution was cooled to room temperature and admitted into an excess volume of methanol for precipitation. The procedure of dissolving the precipitate in acetone and precipitating from an excess of methanol was repeated several times. The precipitate thus purified was dried, yielding about 63 g of poly(2-cyanoethyl acrylate) which had a viscosity of 305 mPa-s as measured in a 20 wt % solution in dimethylformamide at 20° C., a dielectric constant of about 11 at 40° C. and 1 kHz, and a softening temperature of about 30° C.

Using poly(2-cyanoethyl acrylate) as the insulator layer-forming material and copper phthalocyanine (Aldrich) as the semiconductor layer-forming material, an OFET was fabricated by the following procedure and then tested.

On a thermally oxidized silicon substrate, a gate electrode was formed by vapor depositing Ti to a thickness of 20 nm and then Au to a thickness of 60 nm, both by RF sputtering at room temperature and a back pressure of $10^{-4}$ Pa.

On the Au surface of the gate electrode, a 20 wt % solution of poly(2-cyanoethyl acrylate) in N-methyl-2-pyrrolidone which had been passed through a 0.2-μm membrane filter was spin coated and dried at 60° C. for 24 hours, forming an insulator layer of 2 μm thick. This insulator layer had an electrostatic capacity of 6 nF/cm$^2$ at 1 kHz.

Next, copper phthalocyanine was deposited by vacuum evaporation to form a semiconductor layer of 70 nm thick. On X-ray diffractometry analysis, a peak was observed at 2θ=6.8°, indicating that the copper phthalocyanine thin film had alpha-structure.

Next, the substrate was cooled at −20° C., after which Au was deposited on the semiconductor layer to a thickness of 20 nm through a metal mask by RP sputtering at a back pressure of $10^{-5}$ Pa or lower. The source and drain electrodes had a width W of 4.0 mm and were spaced a distance L of 50 μm (see FIG. 1).

The FET thus fabricated was assessed for electrical characteristics under light-shielded condition and a vacuum of $1.3 \times 10^{-3}$ Pa or below.

Figure 2:
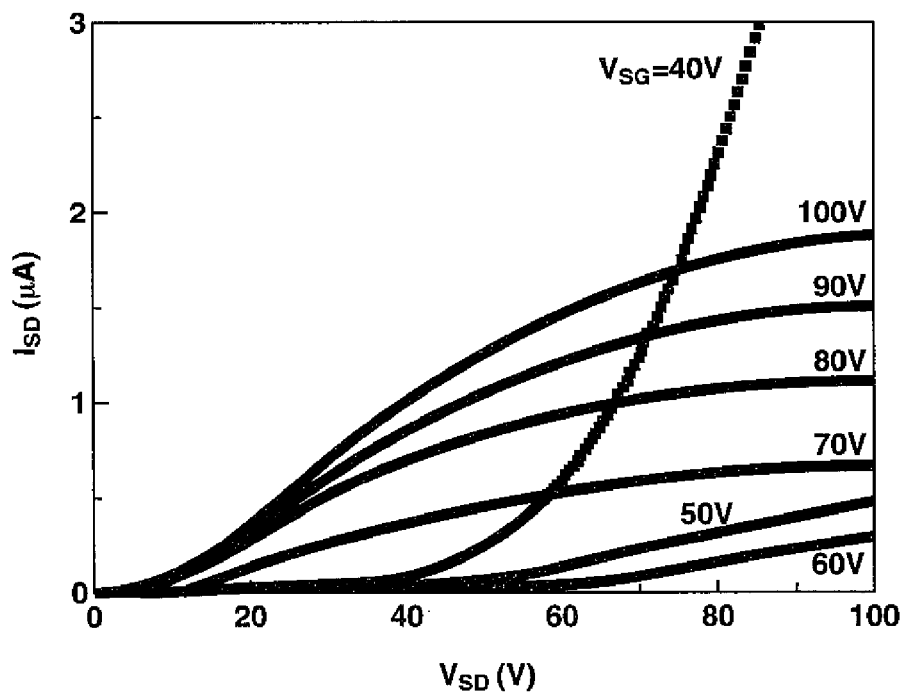
FIG. 2 is a diagram showing $I_{SD}$-$V_{SD}$ curves of an OFET in Example 1.

The source-drain current versus voltage $I_{SD}$-$V_{SD}$ curves were measured at room temperature (25° C.), with the results plotted in FIG. 2. When a positive gate voltage was applied, the transistor exhibited n-type characteristics in that the current value decreases at low gate voltages because a depletion layer forms, but the current value increases at high gate voltages because an inversion layer forms. A mobility was estimated from the channel conductance of the source-drain current versus source-drain voltage curves, finding a field effect mobility of $1.0 \times 10^{-4}$ cm$^2$/Vs.

The FET of Comparative Example 1 (described below) using cyanoethylpullulane as the gate insulating film did not exhibit n-type transistor characteristics only when a voltage was applied, and thus required a polling process. The FET of Example 1 had a field effect mobility which was faster by a factor of nearly 100 than the mobility of the comparative FET after polling, proving a dramatic increase in electron mobility.

Example 2

Figure 3A:
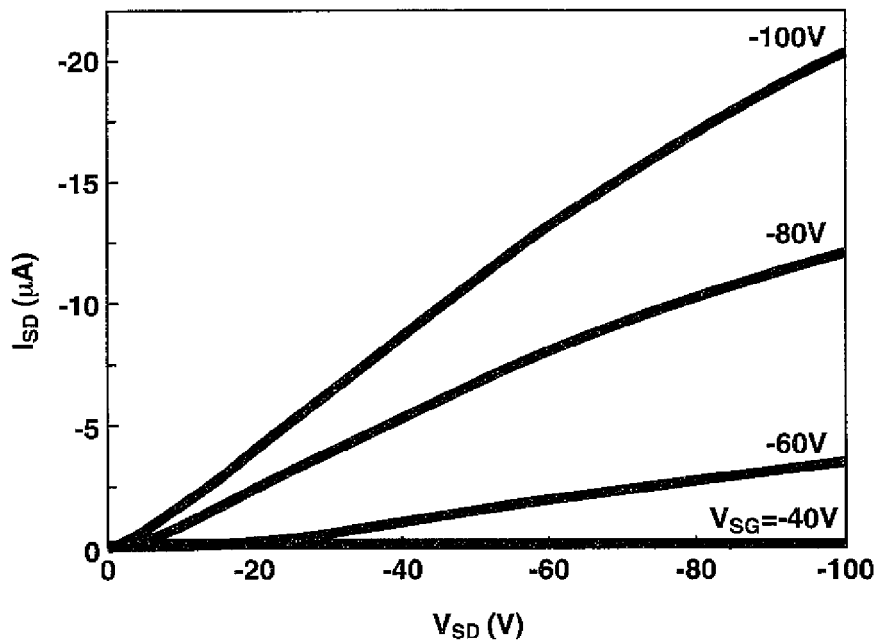
FIG. 3 is a diagram showing $I_{SD}$-$V_{SD}$ curves of an OFET in Example 2.
Figure 3B:
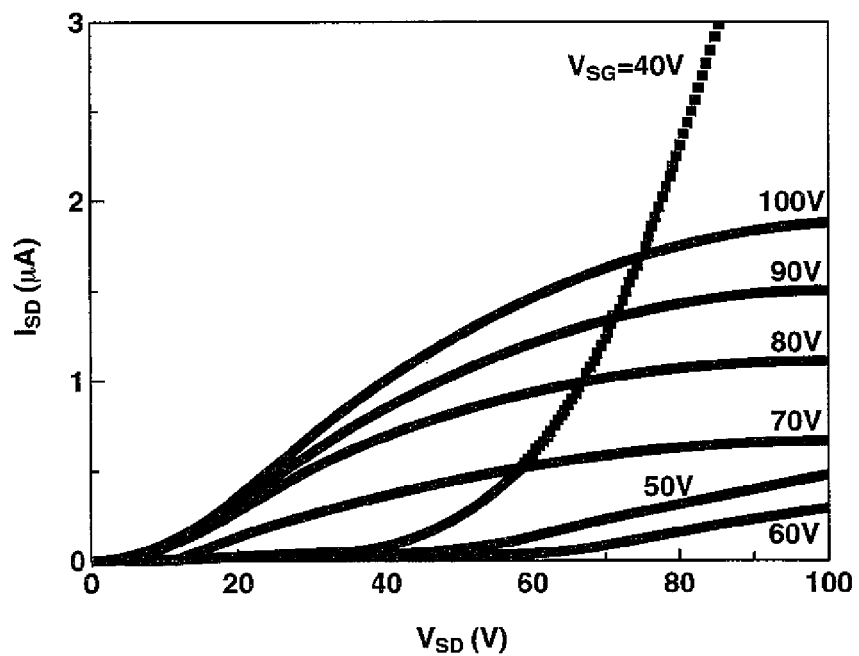

A negative gate voltage was applied across the FET of Example 1. The source-drain current versus voltage $I_{SD}$-$V_{SD}$ curves were measured at room temperature (25° C.), with the results plotted in FIG. 3. The transistor exhibited typical p-type transistor characteristics in that the current value increases with the increasing gate voltage (see FIG. 3A). When a positive gate voltage was applied, the transistor exhibited n-type characteristics in that the current value decreases at low gate voltages because a depletion layer forms, but the current value increases at high gate voltages because an inversion layer forms (see FIG. 3B). It is envisaged that since the copper phthalocyanine layer is of p type and has a significant band gap of 1.5 eV, it takes a weak inversion state despite a large amount of charges accumulated. For this reason, the n-type source-drain current value is as small as 1/10 of the p-type source-drain current value (in the event $|V_g|$=50 V).

Next, a mobility (μ) was estimated from the channel conductance of the source-drain current versus source-drain voltage curves. The mobility for p type was $1.0 \times 10^{-3}$ cm²/Vs, which was approximately equal to that of a FET using silicon oxide as the gate insulating film. On the other hand, the mobility for n type was $1.0 \times 10^{-4}$ cm²/Vs, which was about 1/10 of that for p type.

The FET of Comparative Example 1 (described below) using cyanoethylpullulane as the gate insulating film required a polling process in order to produce n-type transistor characteristics. The n-type field effect mobility of the inventive FET was faster by a factor of nearly 100 than the mobility of the comparative FET after polling, proving a dramatic increase in electron mobility. The on/off ratios of the p-type and n-type at $|V_{SD}|$=50 V were both about 100, and the $V_T$ values were −44 V and 73 V, respectively.

Example 3

A copolymer of 2-cyanoethyl acrylate and 2-cyanoethyl methacrylate having a molar ratio of 50:50 was prepared in the same manner as in Example 1 except that 2-cyanoethyl acrylate monomer and 2-cyanoethyl methacrylate monomer were used instead of 2-cyanoethyl acrylate monomer alone. The resulting copolymer had a viscosity of 332 mPa-s as measured in a 20 wt % solution in dimethylformamide at 20° C., a dielectric constant of about 10 at 40° C. and 1 kHz, and a softening temperature of about 60° C.

By using the copolymer as the insulator layer-forming material, an OFET was fabricated and then tested in the same manner as in Examples 1 and 2. The OFET of Example 3 also showed excellent transistor characteristics like the OFETs of Examples 1 and 2.

Example 4

A copolymer of 2-cyanoethyl acrylate and 2-cyanoethyl methacrylate having a molar ratio of 90:10 was prepared in the same manner as in Example 1 except that 2-cyanoethyl acrylate monomer and 2-cyanoethyl methacrylate monomer were used instead of 2-cyanoethyl acrylate monomer alone. The resulting copolymer had a viscosity of 321 mPa-s as measured in a 20 wt % solution in dimethylformamide at 20° C., a dielectric constant of about 11 at 40° C. and 1 kHz, and a softening temperature of about 40° C.

By using the copolymer as the insulator layer-forming material, an OFET was fabricated and then tested in the same manner as in Examples 1 and 2. The OFET of Example 3 also showed excellent transistor characteristics like the OFETs of Examples 1 and 2.

Comparative Example 1

The material for forming the insulator layer was cyanoethylpullulane having a degree of substitution with cyanoethyl groups of 85.2 mol % (CyEPL, by Shin-Etsu Chemical Co., Ltd., CR-S, Mw: 49,000). The material for forming the semiconductor layer was copper phthalocyanine (Aldrich). Using these materials, an OFET was fabricated by the following procedure and then tested.

On a thermally oxidized silicon substrate, a gate electrode was formed by vapor depositing Ti to a thickness of 20 nm and then Au to a thickness of 60 nm, both by RF sputtering at room temperature and a back pressure of $10^{-4}$ Pa.

On the Au surface of the gate electrode, a 15 wt % solution of cyanoethylpullulane in N-methyl-2-pyrrolidone which had been passed through a 0.2-μm membrane filter was spin coated and dried at 100° C. for one hour, forming an insulator layer of 2 μm thick. This insulator layer had an electrostatic capacity of 17.7 nF/cm² at 1 kHz.

Next, a copper phthalocyanine film of 70 nm thick was formed by vacuum evaporation. On X-ray diffractometry analysis, a peak was observed at 2θ=6.8°, indicating that the copper phthalocyanine thin film had alpha-structure.

Next, the substrate was cooled at −20° C., after which is Au was deposited on the semiconductor layer to a thickness of 300 nm through a metal mask by RF sputtering at a back pressure of $10^{-5}$ Pa or lower. The source and drain electrodes had a width W of 3.9 mm and were spaced a distance L of 38 μm (see FIG. 1).

The FET thus fabricated was assessed for electrical characteristics under light-shielded condition and a vacuum of $1.3 \times 10^{-3}$ Pa or below.

Figure 4:
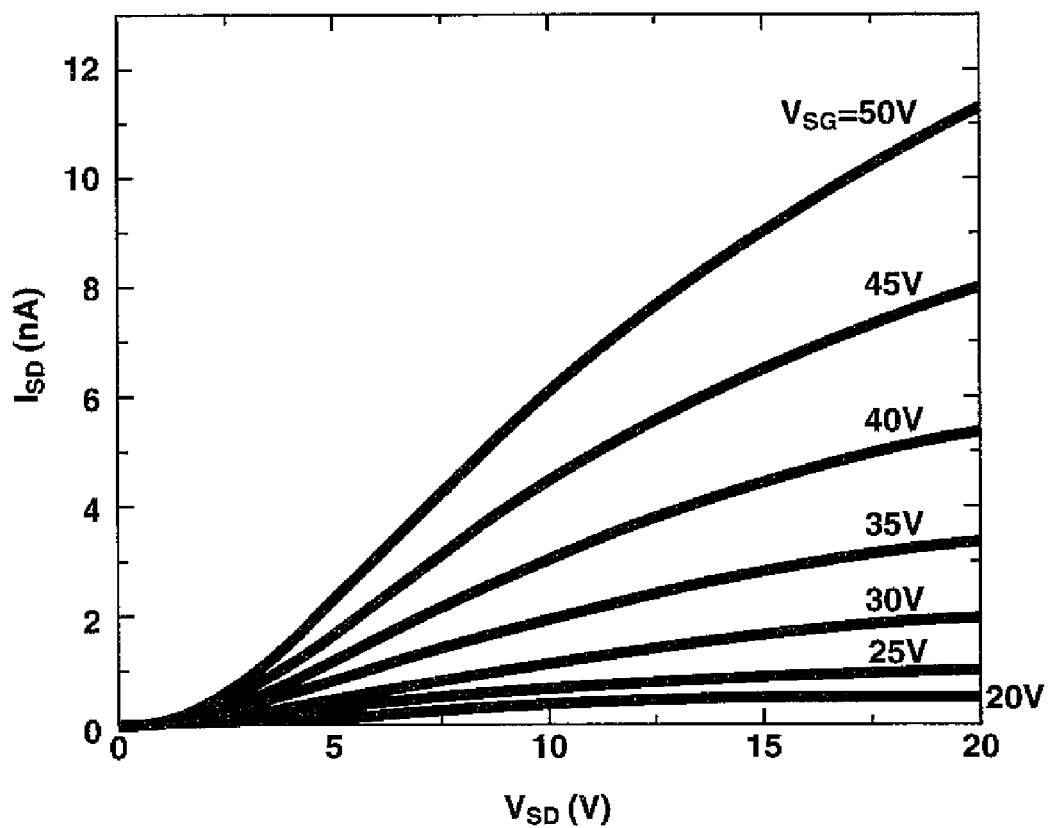
FIG. 4 is a diagram showing $I_{SD}$-$V_{SD}$ curves of an OFET in Comparative Example 1.

Without polling on the insulator film, the source-drain current versus voltage $I_{SD}$-$V_{SD}$ curves were measured at room temperature (25° C.). It is seen from FIG. 4 that in the event of positive gate voltages applied, as the gate voltage increases, the source-drain current decreases and only a depletion layer forms.

Next, to obtain a large accumulated charge quantity, polling was conducted by applying for at least 2,000 seconds a source-gate voltage ($|V_{SG}|$=20 V) which is more than the coercive electric field, after which the source-drain current versus voltage $I_{SD}$-$V_{SD}$ curves were measured at room temperature (25° C.). When a positive gate voltage was applied, the transistor exhibited n-type characteristics in that the current value decreases at low gate voltages because a depletion layer forms, but the current value increases at high gate voltages because an inversion layer forms. It had a field effect mobility of $3.5 \times 10^{-6}$ cm²/Vs when measured as in Example 1.

Comparative Example 2

For the FET of Comparative Example 1, without polling on the insulator film, the source-drain current versus voltage $I_{SD}$-$V_{SD}$ curves were measured at room temperature (25° C.).

Typical p-type characteristics were observed at negative gate voltages. In the event of positive gate voltages, as the gate voltage increased, the source-drain current decreased and only a depletion layer formed.

Figure 5A:
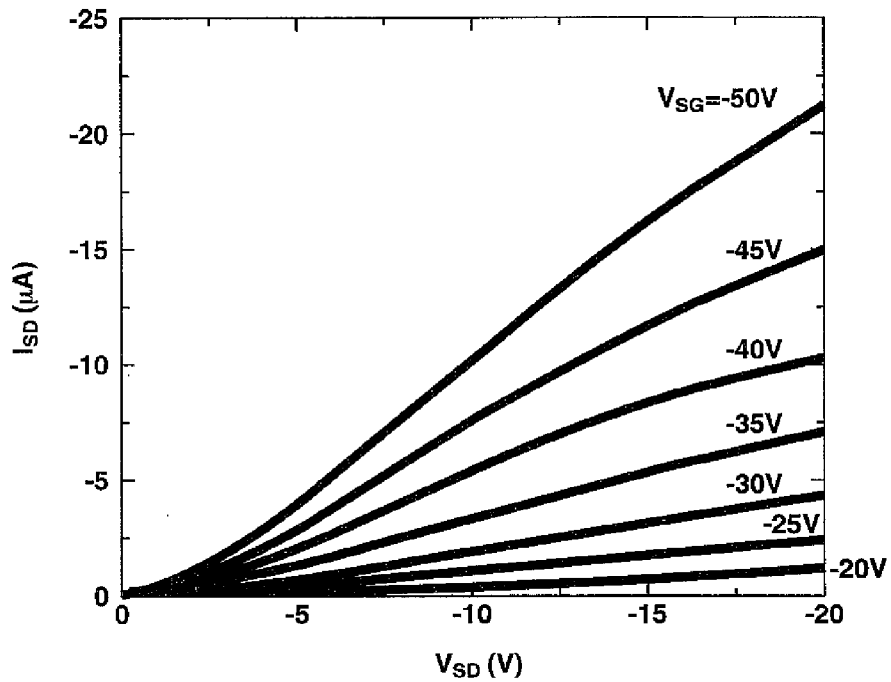
FIG. 5 is a diagram showing $I_{SD}$-$V_{SD}$ curves of an OFET in Comparative Example 2.
Figure 5B:
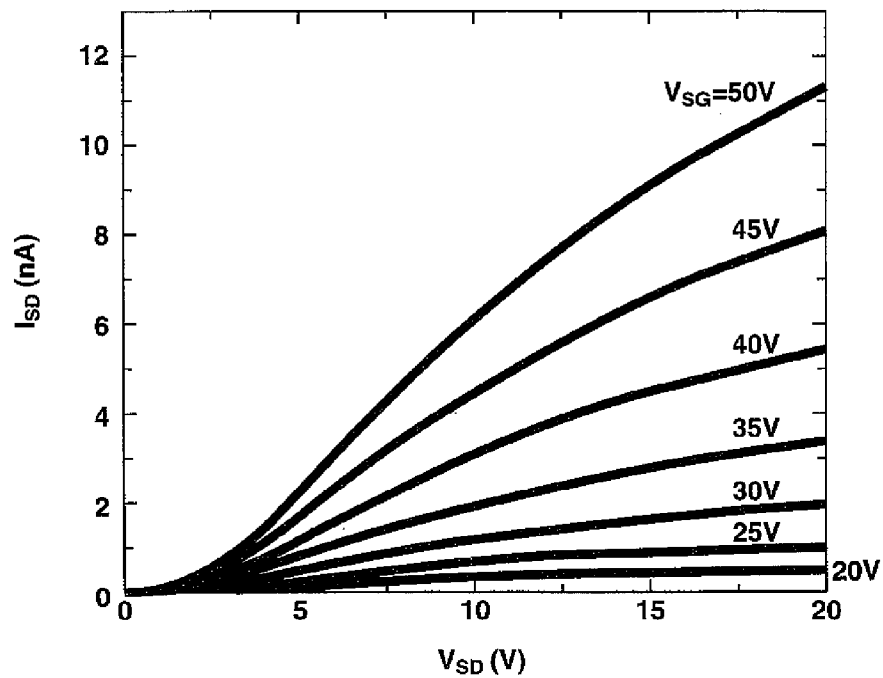

Next, to obtain a large accumulated charge quantity, polling was conducted by applying for at least 2,000 seconds a source-gate voltage ($|V_{SG}|=20$ V) which is more than the coercive electric field, after which the source-drain current versus voltage $I_{SD}$-$V_{SD}$ curves were measured at room temperature (25° C.), with the results shown in FIG. 5. When negative gate voltages were applied, the device produced typical p-type transistor characteristics that the current value increases as the gate voltage increases (See FIG. 5A). In contrast, in the event positive gate voltages were applied, the applied gate voltage promoted depletion with the decreasing current value. However, when the gate voltage exceeded 20 V, the device produced n-type transistor characteristics that an inversion layer is formed and the current value increases (see FIG. 5B). Since the copper phthalocyanine layer is of p type and has a significant band gap of 1.5 eV, it takes a weak inversion state despite a large amount of charges accumulated. For this reason, the n-type source-drain current value is as small as 1/2000 of the p-type source-drain current value (in the event $|V_g|=50$ V). Although the field effect mobility is usually determined from the saturation current value, for this device in which the electrostatic capacity is not determined as Q=CV, the mobility ($f$) was estimated from the channel conductance of source-drain current versus source-drain voltage curves. The equation: $I_{SD}=(W/L)\mu[P+C(V_{SG}-V_T)]V_{SD}$ is used wherein $V_T$ is the threshold voltage when the source-drain current rises. The p-type mobility was $4.1\times10^{-3}$ cm$^2$/Vs, which is substantially equivalent to that of a FET using silicon oxide as the gate insulating film.

The field-effect mobility for the n-type was $3.5\times10^{-6}$ cm$^2$/Vs which is about 1/1000 of that for the p-type. The on/off ratios of the p-type and n-type at $|V_{SD}|=10$ V were $6\times10^4$ and 70, respectively, and the $V_T$ values were −0.1 V and 0.9 V, respectively.

Japanese Patent Application Nos. 2007-078193 and 2007-078195 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. An organic field effect transistor with an electrical conductor-insulator-semiconductor structure, wherein, in said conductor-insulator-semiconductor structure, the material of which the semiconductor layer is made comprises an organic compound, and the material of which the insulator layer is made consists of a polymer obtained through polymerization or copolymerization of a monomer having the formula (1):

$$CH_2=CHCOO-(CH_2)_2-CN \quad (1)$$

and/or a monomer having the formula (2):

$$CH_2=C(CH_3)COO-(CH_2)_2-CN \quad (2).$$

2. The organic field effect transistor of claim 1 wherein said polymer contains the monomers of formulae (1) and (2) in a molar ratio from 100:0 to 50:50.

3. The organic field effect transistor of claim 1 wherein the material of which the semiconductor layer is made is an organic compound which is dissolvable in an organic solvent and has a weight average molecular weight of more than 2,000 to 1,000,000.

4. The organic field effect transistor of claim 3 wherein the material of which the semiconductor layer is made is a polythiophene.

5. The organic field effect transistor of claim 1, wherein said polymer contains the monomers of formulae (1) and (2) in a molar ratio from 90:10 to 50:50.

6. The organic field effect transistor of claim 1 which is a bipolar organic field effect transistor exhibiting both p- and n-type transistor characteristics.

7. A method for fabricating an organic field effect transistor with an electrical conductor-insulator-semiconductor structure, the method comprising the steps of:
applying a solution of a polymer in an organic solvent to a gate electrode in the form of an electrical conductor layer,
drying the applied polymer solution to form an insulator layer on the electrical conductor layer, and
laying a semiconductor layer on the insulator layer,
the polymer being obtained through polymerization or copolymerization of a monomer having the formula (1):

$$CH_2=CHCOO-(CH_2)_2-CN \quad (1)$$

and/or a monomer having the formula (2):

$$CH_2=C(CH_3)COO-(CH_2)_2-CN \quad (2)$$

so that the material of which the insulator is made consists of the polymer obtained through polymerization or copolymerization of the monomer having the formula (1) and/or the monomer having the formula (2), and
wherein in said conductor-insulator-semiconductor structure, the material of which the semiconductor layer is made comprises an organic compound.

8. A bipolar organic field effect transistor exhibiting both p- and n-type transistor characteristics and having an electrical conductor-insulator-semiconductor structure, wherein the material of which the semiconductor layer is made comprises an organic compound, and the material of which the insulator layer is made comprises a polymer obtained through polymerization or copolymerization of a monomer having the formula (1):

$$CH_2=CHCOO-(CH_2)_2-CN \quad (1)$$

and a monomer having the formula (2):

$$CH_2=C(CH_3)COO-(CH_2)_2-CN \quad (2), and$$

wherein said polymer contains the monomers of formulae (1) and (2) in a molar ratio from 90:10 to 50:50.

* * * * *